United States Patent
Iizaka

(10) Patent No.: US 10,085,354 B2
(45) Date of Patent: Sep. 25, 2018

(54) FLEXIBLE PRINTED CIRCUIT (FPC) BOARD

(71) Applicant: SUMITOMO ELECTRIC DEVICE INNOVATIONS, INC., Yokohama-shi (JP)

(72) Inventor: Shinya Iizaka, Yokohama (JP)

(73) Assignee: SUMITOMO ELECTRIC DEVICE INNOVATIONS, INC., Yokohama-shi (JP)

(*) Notice: Subject to any disclaimer, the term of this patent is extended or adjusted under 35 U.S.C. 154(b) by 0 days.

(21) Appl. No.: 15/840,054

(22) Filed: Dec. 13, 2017

(65) Prior Publication Data

US 2018/0103549 A1  Apr. 12, 2018

Related U.S. Application Data

(62) Division of application No. 14/839,109, filed on Aug. 28, 2015, now abandoned.

(30) Foreign Application Priority Data

Aug. 29, 2014 (JP) .................................. 2014-175503
Aug. 29, 2014 (JP) .................................. 2014-175532

(51) Int. Cl.
    *H05K 1/00* (2006.01)
    *H05K 3/36* (2006.01)
    (Continued)

(52) U.S. Cl.
    CPC ........... *H05K 3/363* (2013.01); *H05K 1/0281* (2013.01); *H05K 1/113* (2013.01); *H05K 1/118* (2013.01);
    (Continued)

(58) Field of Classification Search
    CPC ...... H05K 1/0281; H05K 1/113; H05K 1/118; H05K 1/147; H05K 2201/09563; H05K 3/363

See application file for complete search history.

(56) References Cited

U.S. PATENT DOCUMENTS

| 7,439,449 B1 * | 10/2008 | Kumar ................. G02B 6/4292 174/254 |
| 7,983,756 B2 * | 7/2011 | Nicolelis .............. A61N 1/0529 600/377 |

(Continued)

FOREIGN PATENT DOCUMENTS

| JP | H5-335689 A | 12/1993 |
| JP | 2007-123741 A | 5/2007 |
| JP | 2011-238883 A | 11/2011 |

*Primary Examiner* — Yuriy Semenenko

(74) *Attorney, Agent, or Firm* — Venable LLP; Michael A. Sartori; Laura G. Remus

(57) ABSTRACT

A flexible printed circuit (FPC) board having reinforcing pattern against bending is disclosed. The FPC board provides an RF interconnection extending from an RF electrode. Two ground electrodes are formed in respective sides of the RF electrode. The ground electrodes extend respective extended portions along the RF interconnection to protect the RF interconnection from breakage due to bending of the FPC board. The extended portion provides an end portion bent toward the RF interconnection to compensate for impedance mismatching of the RF interconnection.

6 Claims, 6 Drawing Sheets

(51) Int. Cl.
*H05K 1/14* (2006.01)
*H05K 1/11* (2006.01)
*H05K 1/02* (2006.01)

(52) U.S. Cl.
CPC ... *H05K 1/147* (2013.01); *H05K 2201/09563* (2013.01)

(56) References Cited

U.S. PATENT DOCUMENTS

| | | | |
|---|---|---|---|
| 2004/0062491 A1* | 4/2004 | Sato | G02B 6/4201 385/88 |
| 2005/0265650 A1* | 12/2005 | Priyadarshi | G02B 6/4201 385/14 |
| 2006/0062526 A1* | 3/2006 | Ikeuchi | G02B 6/4201 385/88 |
| 2006/0109394 A1 | 5/2006 | Miyagawa et al. | |
| 2007/0102830 A1* | 5/2007 | Muto | H05K 1/0219 257/784 |
| 2010/0252307 A1 | 10/2010 | Mo | |
| 2012/0128290 A1 | 5/2012 | Han et al. | |
| 2014/0085856 A1 | 3/2014 | Shirao et al. | |
| 2014/0241659 A1* | 8/2014 | Fukuda | G02F 1/0121 385/3 |

* cited by examiner

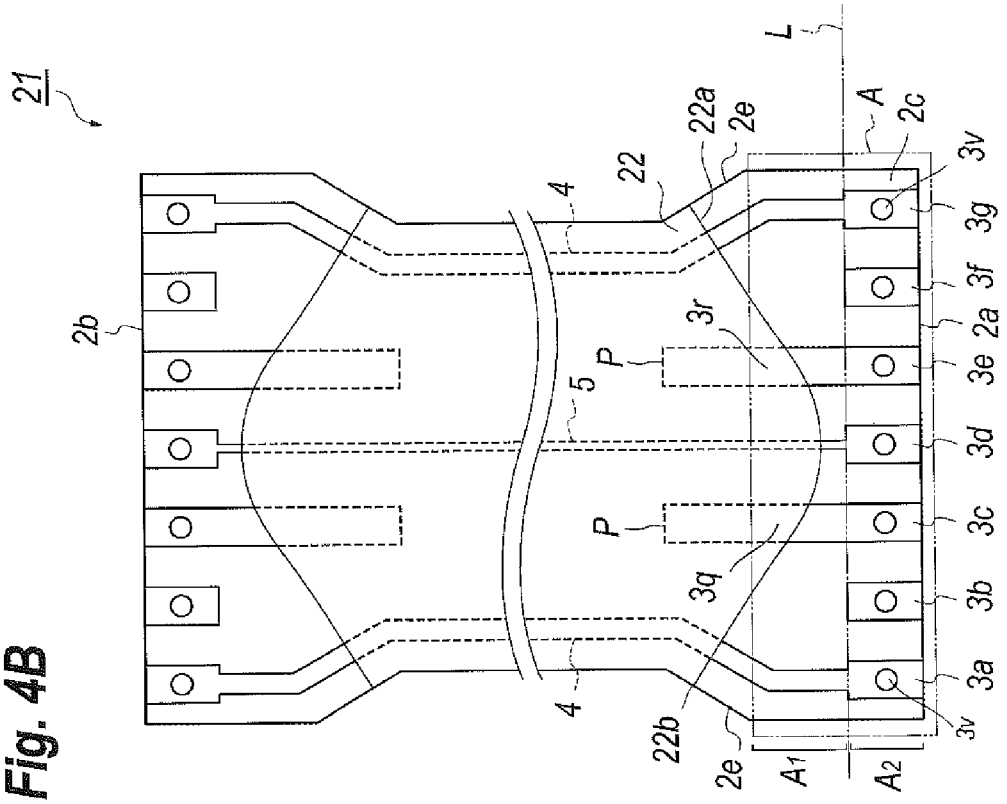
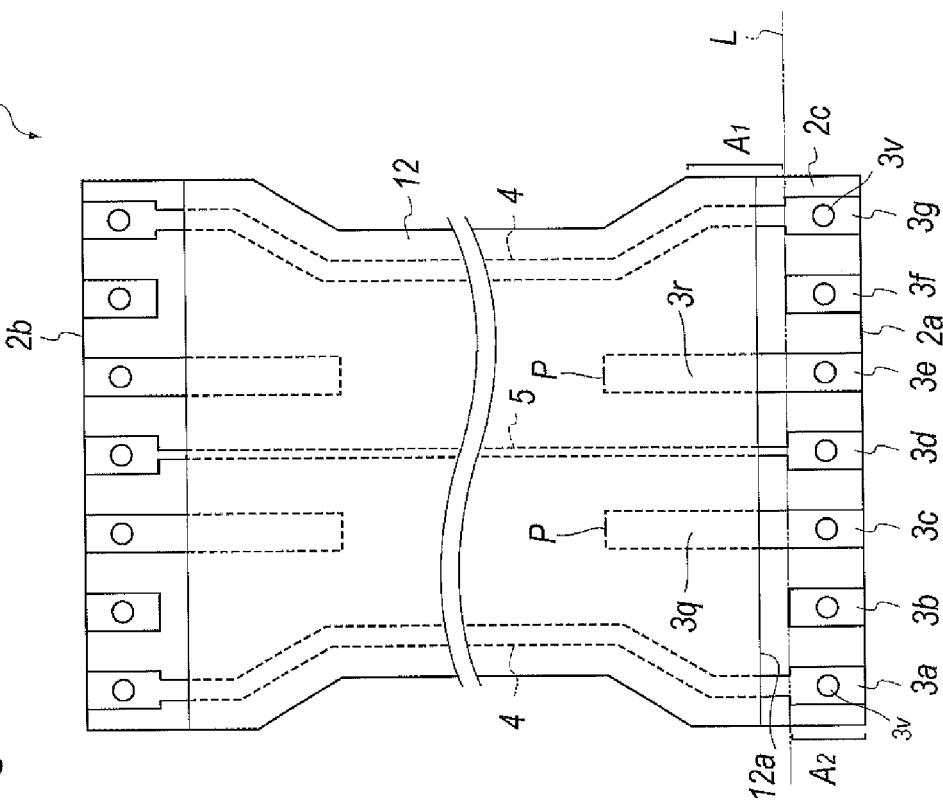

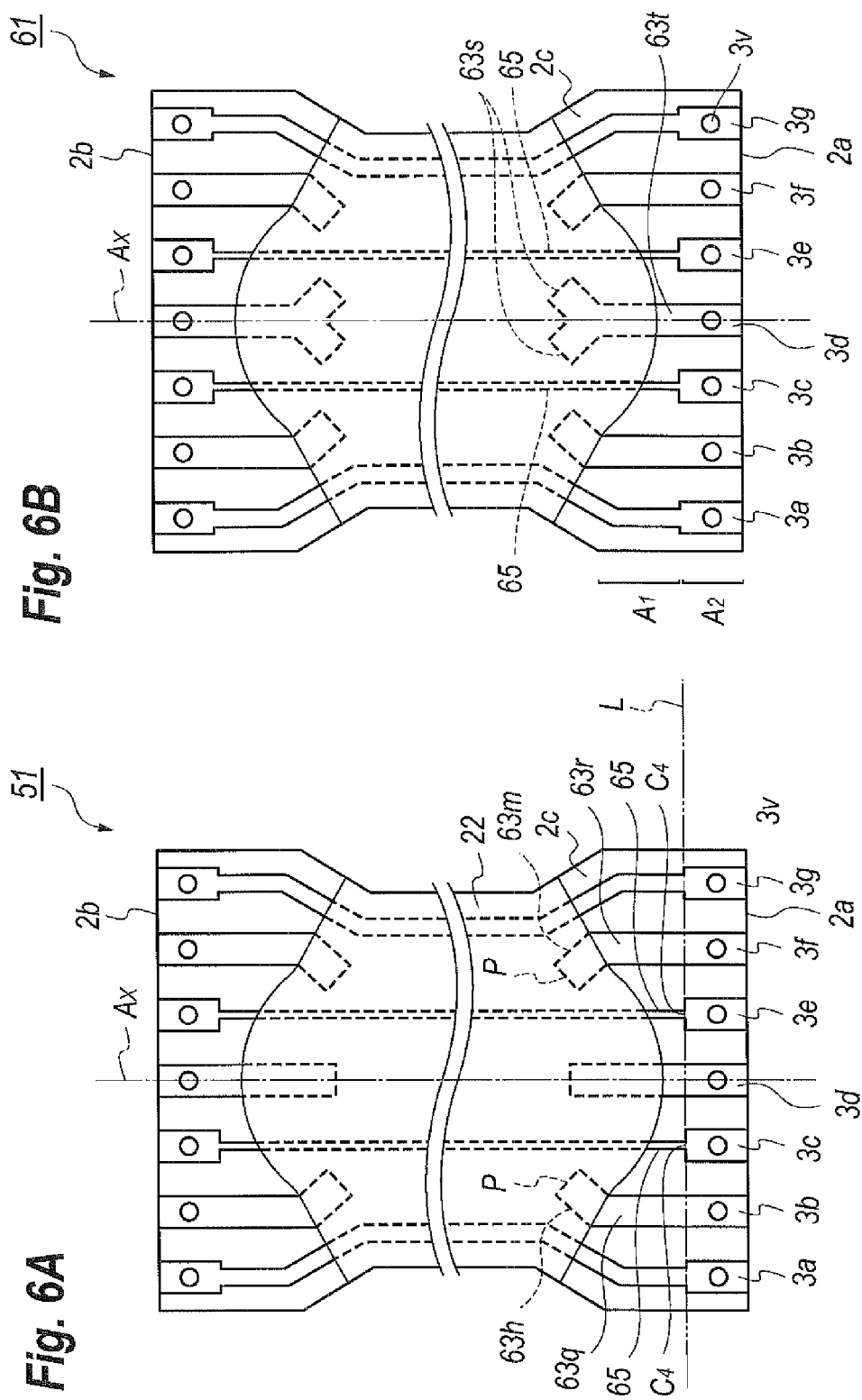

US 10,085,354 B2

FLEXIBLE PRINTED CIRCUIT (FPC) BOARD

CROSS-REFERENCE TO RELATED APPLICATIONS

This application is a Divisional of U.S. patent application Ser. No. 14/839,109, filed Aug. 28, 2015, which claims the benefit of Japanese Patent Application Nos. 2014-175503 and 2014-175532, filed Aug. 29, 2014.

BACKGROUND OF THE INVENTION

1. Field of the Invention

The present invention relates to an arrangement of a flexible printed circuit (FPC) board.

2. Background Arts

An FPC board has been often used to connect an electrical or optical module with a printed circuit board. Recent modules may operate at a speed reaching or sometimes exceeding 10 Gbps and an FPC board is inevitable to carry such high speed signals thereon. In order to transmit a high speed signal as keeping quality thereof, a transmission line often takes an arrangement of the micro-strip line and/or the co-planar line. When the FPC board arranges the micro-strip line and/or the co-planar line, a line or an interconnection on the FPC board often becomes slim enough. Such a line is easily broken due to a bend of an FPC board.

SUMMARY OF THE INVENTION

An aspect of the present invention relates to an FPC board that is to be soldered to a rigid circuit board. The FPC board comprises a top electrode provided in the top surface of one end of the FPC board; and a back electrode provided in the back surface of the one end of the FPC board. The top electrode is electrically connected to the back electrode through a via hole. The back electrode is to be soldered to a pad provided in the rigid circuit board. A feature of the FPC board is that at least one of the top electrode and the back electrode extends an interconnection, while, another of the top electrode and the back electrode extends an extended portion that is terminated in the one end of the FPC board.

Another FPC board of the present application includes a top RF electrode, a back RF electrode, a top ground electrode, and a back ground electrode. The top RF electrode and the top ground electrode are provided in one end of a top surface of the FPC board. The back RF electrode and the back ground electrode are provided in the one end of a back surface of the FPC board and soldered to the rigid circuit board. The top ground electrode is provided next to the top RF electrode and the back ground electrode is provided next to the back RF electrode. The top RF electrode is electrically connected to the back RF electrode through a via hole, while, the top ground electrode is electrically connected to the back ground electrode through a via hole. The back ground electrode extends a ground pattern as forming a gap to the back RF electrode. A feature of the FPC board is that the top RF electrode extends an RF interconnection; while, the top ground electrode extends an extended portion terminated in the one end of the FPC board.

Still another FPC board of the present application includes top RF electrodes and top ground electrodes both provided in one end of the top surface of the FPC board, and back RF electrodes and back ground electrodes both provided in the one end of a back surface of the FPC board. The top RF electrodes are electrically connected to the back RF electrodes through via holes, and the top ground electrodes are electrically connected to the back ground electrodes through via holes. The top RF electrodes and the top ground electrodes are arranged alternately, and the back RF electrodes and the back ground electrodes are arranged alternately. The back RF electrodes and the back ground electrodes are to be soldered to the rigid circuit board. The back ground electrodes are electrically connected through a ground pattern with gaps against the back RF electrodes. A feature of the FPC board is that the top RF electrodes extend RF interconnections, while, the top ground electrodes each has an extended portion with a width substantially equal to widths of the top ground electrodes and terminated in the one end of the FPC board.

BRIEF DESCRIPTION OF THE DRAWINGS

The foregoing and other purposes, aspects and advantages will be better understood from the following detailed description of a preferred embodiment of the invention with reference to the drawings, in which:

FIG. 4A is a plan view of a top surface of an FPC board according to the third embodiment, and FIG. 4B is a plan view of an FPC board according to the fourth embodiment of the present application;

FIG. 6A is a plan view of a top surface of an FPC board according to the seventh embodiment of the present application, and FIG. 6B is a plan view of a top surface of an FPC board modified from the FPC board shown in FIG. 6A.

DESCRIPTION OF EMBODIMENTS

Next, some embodiments according to the present invention will be described as referring to drawings. In the explanation of the drawings, numerals or symbols same with or similar to each other will refer to elements same with or similar to each other without duplicating explanations.

(First Embodiment)

Figure 1A:
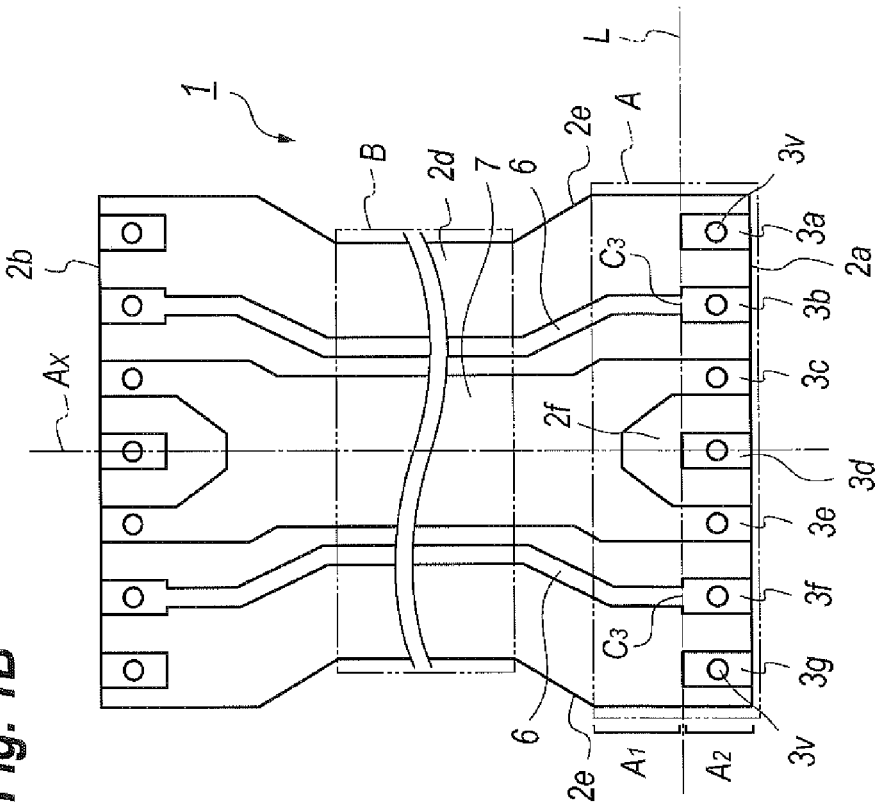
FIG. 1A is a plan view of a top surface of a flexible printed circuit (FPC) board according to the first embodiment of the present application.
Figure 1B:
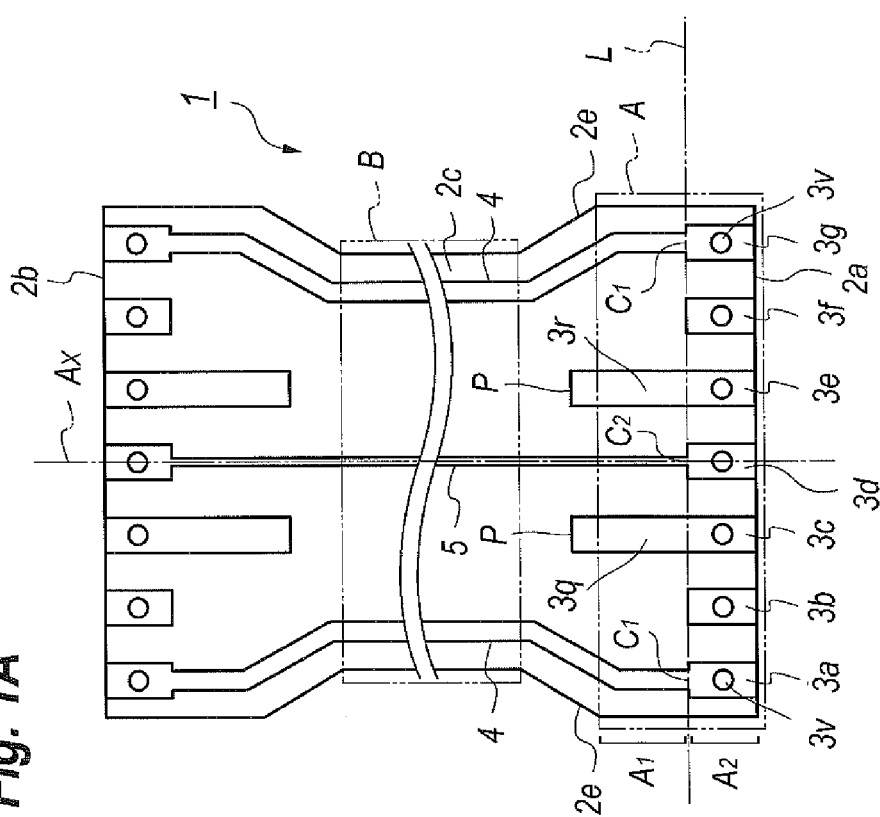
FIG. 1B is a plan view of a back surface of the FPC board shown in FIG. 1A.

FIGS. 1A and 1B are plan views of a flexible printed circuit (FPC) board 1 according to the first embodiment of the present invention, where FIG. 1A illustrates a top surface and FIG. 1B shows a back surface thereof. The FPC board 1 shown in FIGS. 1A and 1B is implemented within an optical transceiver; specifically, the FPC board 1 is prepared independently for a transmitter optical subassembly and a receiver optical subassembly to electrically connect those subassemblies with a printed circuit board.

The FPC board 1 provides the top and bottom surfaces, $2c$ and $2d$, respectively, and two ends, $2a$ and $2b$. The FPC board 1 further provides, in the end portion A, a plurality of electrodes (top electrodes), $3a$ to $3g$, interconnections 4 extending from respective outer most electrodes, $3a$ and $3g$, and an RF (Radio Frequency) interconnection 5 connected to the center electrode 3d, which will be called as the RF electrode. Moreover, the FPC board 1 in the back surface 2d thereof also provides electrodes (back electrodes), 3a to 3g, interconnections 6 extending from the electrodes 3b and 3f, and a ground (GND) pattern 7 connected to the electrodes 3c and 3e. The other end portion opposite to the end portion A also provides seven (7) electrodes corresponding to the electrodes, 3a to 3g, in the end portion A. The electrodes, 3a to 3g, in the top surface 2c are electrically connected to electrodes, 3a to 3g, in the back surface 2d through respective via holes 3v.

The FPC board 1 of the present embodiment shows a line symmetry with respect to an axis Ax passing from a center of the first edge 2a to the second edge 2b. The first and second edges, 2a and 2b, each extends straight and intersects the axis Ax in a right angle. The FPC board 1, as illustrated in FIGS. 1A and 1B, provides a narrowed mid body between two widened end portions A, and joining portions 2e having a width gradually increasing from the interface to the mid body to the other interface to the end portion A.

The electrodes, 3a to 3g, which are made of metals, provide via holes 3v electrically connecting portions in the top surface 2c to other portions in the back surface 2d. The electrodes, 3a to 3g, in the back surface 2d thereof are to be soldered to respective pads provided in the rigid circuit board 10.

Figure 2:
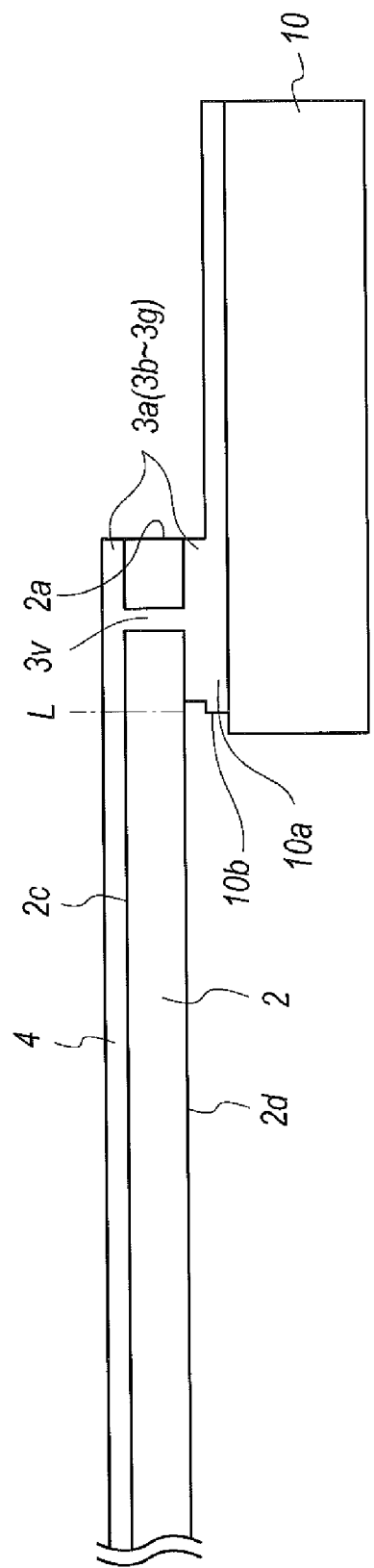
FIG. 2 shows a cross section of the FPC board soldered to a rigid circuit board.

Referring to FIG. 2, the FPC board 1 is soldered to the rigid substrate 10 such that the boundary L of the FPC board 1, which distinguishes the electrodes, 3a to 3g, from the interconnections, 4 and 6, the RF interconnection 5, and the ground pattern 7, coincides with the edge 10b of the pad 10a. Specifically, referring to FIGS. 1A and 1B again, the end portion A may be divided in two regions, $A_1$ and $A_2$, one of which $A_2$ provides the electrodes, 3a to 3g, while, the other $A_2$ set inward from the former region $A_1$ provides extended electrodes, 3c and 3e. The former region $A_2$ may be called as the electrode region and the latter is called as the extended region. The electrodes, 3a to 3g, extend inward from the edge 2a as intersecting the edge 2a in a right angle; that is, the edges of the electrodes, 3a to 3g, coincide with the edge 2a of the FPC board 1, and the other edge of the electrodes, 3a, 3b, 3d, 3f, and 3g, align with the boundary line L. The boundary line L virtually connects the boundary $C_1$ between the electrodes, 3a and 3g, and the interconnection 4 to the boundary $C_2$ between the electrode 3d and the RF interconnection 5. On the other hand, the inner edges of the electrodes, 3c and 3e, also extend inward as crossing the boundary line L.

The interconnection 4 extend, in the top surface 2c of the FPC board 1, from the ends $C_1$ of the electrodes, 3a and 3g, and run in parallel with edges of the joining portion 2e. The RF interconnection 5 extends straight in the top surface 2c from the end $C_2$ of the electrode 3d along the center axis Ax. Because portions in the back surface 2d corresponding to the RF interconnection 5 provide the ground pattern, which emulates the micro-strip transmission line, the RF interconnection 5 inherently has characteristic transmission impedance capable of transmitting high frequency signals reaching and sometimes exceeding 10 Gbps between the optical subassemblies and the rigid circuit board 10. In order to show the characteristic transmission impedance, the RF interconnection 5 has a width narrower than a width of the interconnections, 4 and 6.

In the back surface 2d, the end of the electrode 3d forms a gap 2f to the ground pattern connected to the electrodes, 3c and 3e, in respective sides of the center electrode 3d. However, the RF interconnection 5 in the top surface 2c in the portion corresponding to the gap 2f has the width substantially same with that in the mid body. Accordingly, the RF interconnection 5, in particular, the portion corresponding to the gap shows the characteristic impedance slightly greater than that in the mid body. This impedance mismatching may degrade quality of high frequency signals carried on the RF interconnection 5.

The FPC board 1 further provides another interconnection 6 extending inward from the boundary $C_3$ against the electrodes, 3b and 3f, in the back surface 2d. The interconnection 6 also runs substantially in parallel to the edges of the joining portion 2e and to the edge of the ground pattern in the mid body. The ground (GND) pattern 7, as described above, extend from the electrodes, 3c and 3e, in respective sides of the center electrode 3d and combined in the extended region $A_1$ to occupy a large part of the back surface 2d of the mid body, in particular, the whole center portion of the back surface 2d corresponding to the RF interconnection 5 in the top surface 2c. The center pad 3d connected to the RF interconnection 5 and two electrodes, 3c and 3e, in respective sides of the center electrode 3d imitates the co-planar transmission line which may partly compensate the impedance mismatching caused in the RF interconnection 5 in the part of the gap 2f The interconnections, 4 and 6, with widths wider than that of the RF interconnection 5 may carry DC signals or signals having low frequency components. Those signals are unconcerned with the transmission impedance.

The FPC board 1 of the present embodiment provides in the electrodes, 3c and 3e, respective extended portions, 3q and 3r, extending straight within the extended region $A_1$ as keeping a width thereof from the edge 2a. Although the extended portion, 3q and 3r, are set in respective sides of the RF interconnection 5, the extended portions, 3q and 3r, do not affect the characteristic impedance of the RF connection 5. The characteristic impedance of the RF interconnection 5 may be primarily determined by the width thereof and the ground pattern 7 in the back surface 2d. The function of the extended portions, 3q and 3r, are to reinforce the FPC board 1 against the bending, that is, to protect the RF interconnection 5 from a breakage by the bending of the FPC board 1.

Referring to FIG. 2 again, when the FPC board 1 is connected to the rigid circuit board 10, the all electrodes, 3a to 3g, are soldered to the pads 10a on the circuit board 10, and the FPC board 1 is often bent upward to connect the electrodes, 3a to 3g, in the other end 2b to the optical modules. Under such an arrangement, the FPC board 1 is likely to be bent along the boundary line L by a small radius, which often causes breakages of the interconnections, 4 to 6, in particular the RF interconnection 5 because of the narrowed line width thereof.

The extended portions, 3q and 3r, which extend from the electrodes, 3c and 3e, to the joining portion 2e, that is, the ends P of the extended portions, 3q and 3r, exist within the joining portion 2e, as keeping the widened width thereof may effectively prevent the FPC board 1 from being bent along the boundary line L or bent in the extended region $A_1$ without influencing the electrical characteristics of the RF interconnection 5.

The FPC board 1 of the present embodiment provides the extended portions only in the electrodes, 3c and 3e, which are electrically connected to the ground pattern 7. The FPC board 1 may provide other extended portions in the electrodes, 3b and 3f, in the top surface 2c, and in the electrodes, 3g and 3a, in the back surface 2d. The former electrodes, 3b and 3f, are electrically connected to the interconnections 6 in the back surface 2d, while, the latter electrodes, 3a and 3g, are connected to the other interconnections 4 in the top surface 2c. These interconnections, 4 and 6, carry DC signals and/or signals with lower frequency components; accordingly, the extended portions to be provided in those electrodes, 3a, 3b, 3f and 3g, may not influence the electrical performance of the FPC board 1. Those extended portions may effectively suppress the FPC board 1 from being bent along the boundary line L when the electrodes, 3a to 3g, in the back surface 2d thereof are soldered to the pads 10a on the rigid board.

(Second Embodiment)

Figure 3A:
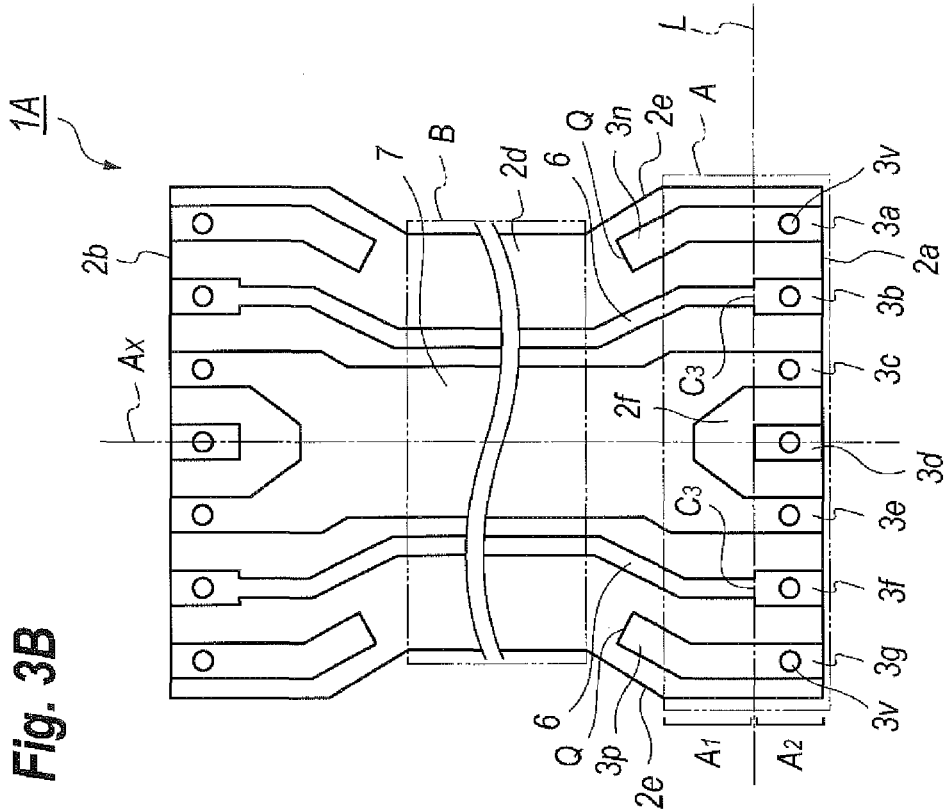
FIG. 3A is a plan view of a top surface of another FPC board according to the second embodiment.
Figure 3B:
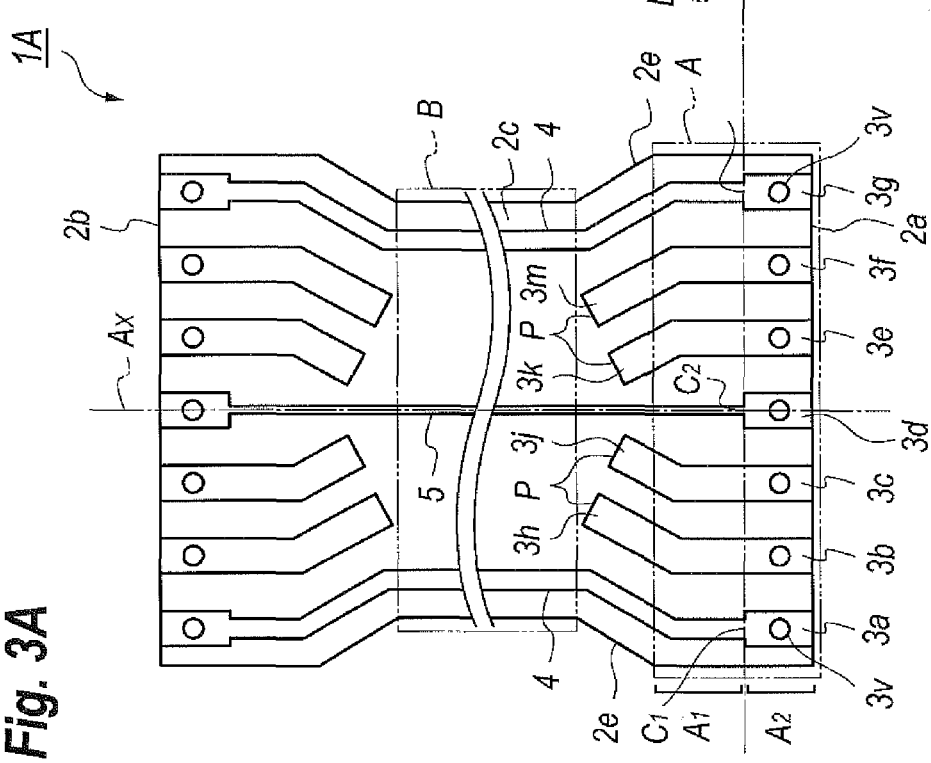
FIG. 3B is a plan view of a back surface of the FPC board shown in FIG. 3A.

FIGS. 3A and 3B show top and back surfaces of an FPC board 1A according to the second embodiment of the present invention. The FPC board 1A shown in FIGS. 3A and 3B is an example that all electrodes, 3a to 3c and 3e to 3g, provided for DC signals including the ground and/or signals with low frequency components have respective extended portions in the extended regions $A_1$ and the joining portion 2e. One feature of the present embodiment is that the extended portions are bent inward along the edge of the joining portion 2e.

Specifically, the electrodes, 3c and 3e, put in respective sides of the RF electrode 3d have the end portions, 3j and 3k, extending from the edge 2a as maintaining the widths thereof and bent inward in the extended region $A_1$. Accordingly, the end P of the end portions, 3j and 3k, come closer to the RF interconnection 5 in the joining portion 2e. As described, the RF interconnection 5 shows slight impedance mismatching at the portion corresponding to the gap 2f in the back surface 2d, which increases the characteristic impedance of the RF interconnection 5. The arrangement of the end portions, 3j and 3k, bent closer to the RF interconnection 5, which may decrease the characteristic impedance of the RF interconnection 5, may compensate for the impedance mismatching at the gap.

Other end portions, 3p and 3n, for the electrodes, 3a and 3g, in the top surface 2c, and portions, 3h and 3m, for the electrodes, 3b and 3f, in the top surface 2c do not affect the electrical characteristic of the FPC board 1A because those electrodes, 3a, 3b, 3f, and 3g, are connected to DC signals and/or signals with low frequency components. Those end portions, 3a, 3b, 3f, and 3g, extending as keeping respective widths may effectively contribute to protect the RF interconnection 5 from being broken by bending along the line L or in the extended region $A_1$. Because those end portions, 3h to 3p, are bent inward in the extended region, a length intersected by the inner edge of the end portion A becomes longer, which further become effective against the bending of the FPC board 1A.

(Third Embodiment)

FIG. 4A is a plan view of a still another FPC board 11 according to the third embodiment of the present application. The embodiment shown in FIG. 4A has a feature that the FPC board 11 provides an overlay 12 to cover the mid body thereof and a most part of the extended region $A_1$. Other arrangements of the FPC board 11 are substantially same with those of the first embodiment shown in FIGS. 1A and 1B, and will omit the explanations thereof.

The overlay 12 provided in the FPC board 11, which may be made of resin, covers almost all portions of the interconnection 4 and the RF interconnection 5. The edge 12a of the overlay 12 exits in the extended region $A_1$, exactly, in a side of the electrode region $A_2$ of the extended region $A_1$, which means that the overlay 12 covers greater part of the extended region $A_1$. The FPC board 11 of the embodiment further provides the extended portions, 3q and 3r, extending from the electrodes, 3c and 3e, in respective sides of the center electrode 3d and electrically connected to the ground pattern 7 in the back surface, whose ends P exist in the joining portion 2e crossing the extended region $A_1$. Assuming that no extended portions are provided in the electrodes, 3c and 3e, nor other DC electrodes, 3b and 3f, and/or, DC electrodes, 3a and 3b, the FPC board 11 is easily bent along the edge 12a of the overlay 12 compared with a case that the FPC board 11 is bent along the boundary line L. The extended portions, 3q and 3r, may effectively protect the RF interconnection 5 from breakages by the bending of the FPC board 11 along the edge 12a of the overlay 12 and along the boundary line L.

(Fourth Embodiment)

FIG. 4B is a plan view of a top surface of a still another embodiment of the FPC board 21 according to the present application. A feature of the FPC board 21 distinguishable from the aforementioned embodiment is that an overlay 22 provided in the FPC board 21 has a curved edge 22a. Other arrangements including materials of the overlay 22 are same with those of the third embodiment. The overlay 12 of the present embodiment has a curved edge 22a. Specifically, the overlay 22 extends in a center portion thereof toward the edge 2a of the FPC board 21, while, retreats in respective side portions to expose the whole extended regions $A_1$ such that the edges 22b of the overlay 22 locate on the joining portions 2e. Thus, the overlay 22 may cover or protect the RF interconnection 5 further effectively.

(Fifth Embodiment)

Figure 5A:
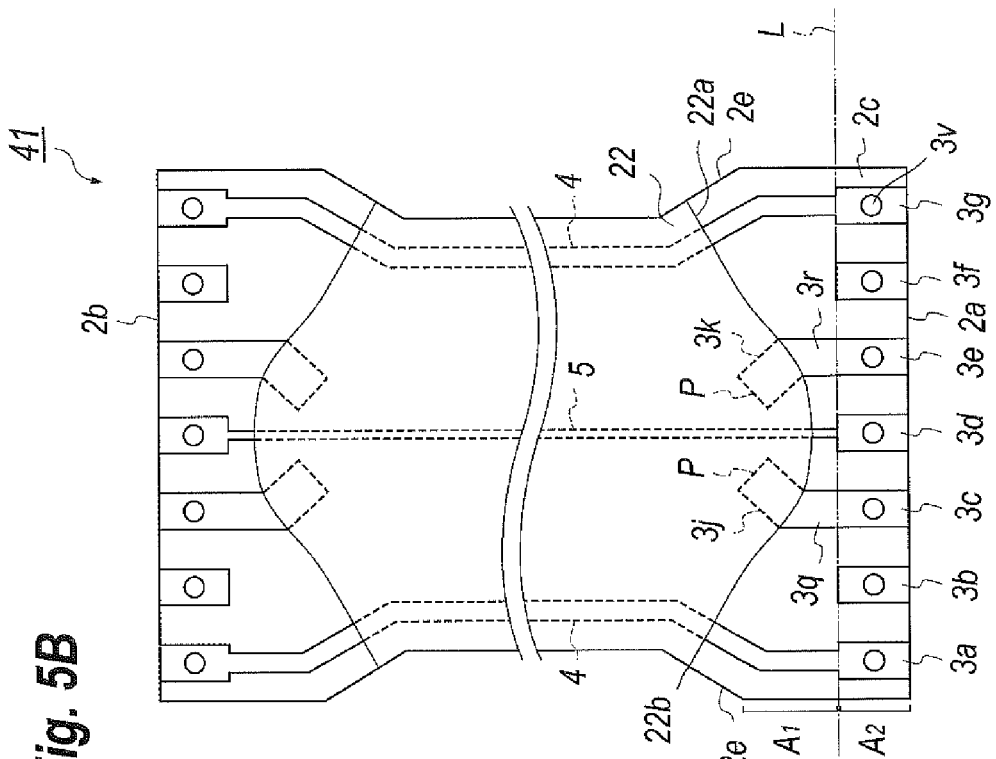
FIG. 5A is a plan view of a top surface of an FPC board according to the fifth embodiment.

FIG. 5A is a plan view of the top surface 2c of an FPC board 31 according to still another embodiment of the present application. The FPC board 31 shown in FIG. 5A provides the interconnections, 4 and 5, and electrodes, 3a to 3g, substantially same as those of the second embodiment shown in FIG. 3A except that the electrodes, 3b and 3f, have no extended portions. Moreover, the FPC board 31 provides the overlay 12 that covers whole of the mid body and almost whole of the extended region $A_1$. That is, the edge 12a of the overlay 12 comes closer to the electrode region $A_2$ or the boundary line L. Because the end portions, 3j and 3k, are bent inward, namely, closer to the RF interconnection 5, the end portions, 3j and 3k, may compensate for the impedance mismatching caused in the portion corresponding to the gap between the ground pattern 7 and the electrode 3d in the back surface 2d.

(Sixth Embodiment)

Figure 5B:
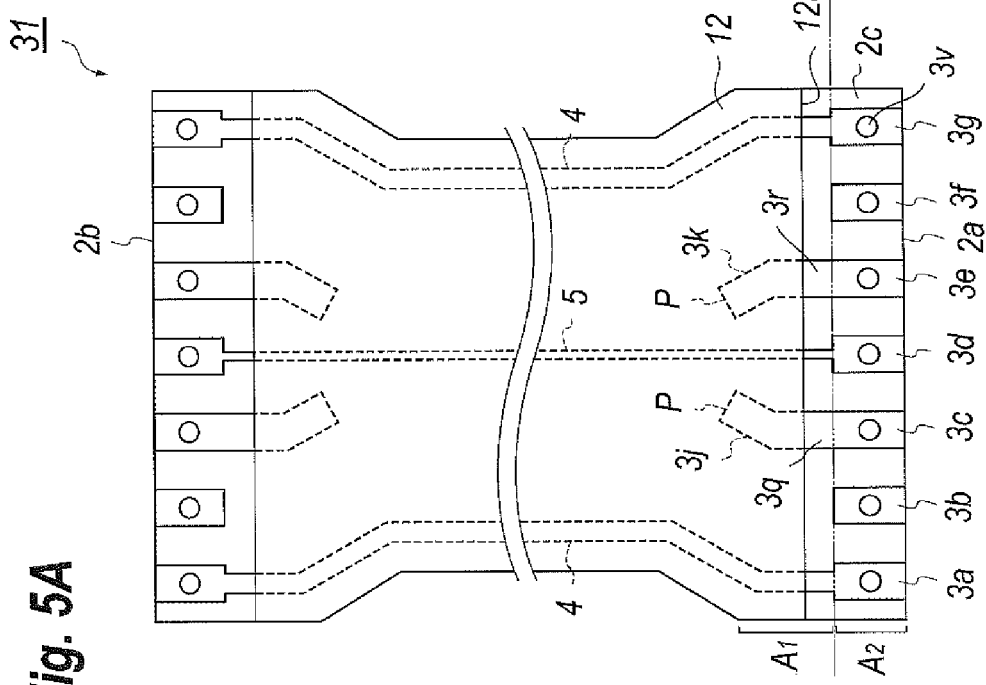
FIG. 5B is a plan view of an FPC board according to the sixth embodiment of the present application.

FIG. 5B is a plan view of still another FPC board 41 according to one embodiment of the present invention. The FPC board 41 provides the interconnections, 4 and 5, and the electrodes, 3a to 3g, same with those of the FPC board 31 shown in FIG. 5A and the overlay 22 same with those shown in FIG. 4B. That is, the overlay 22 has the edge 22a with a convex center covering the RF interconnection 5 closer to the center electrode 3d in the extended region $A_1$ and side portions retreated from the extended region $A_1$ to the joining portion 2e to expose the interconnections 4. The ends P of the end portions, 3j and 3k, brought from respective extended portions, 3q and 3r, of the electrodes, 3c and 3e, put in the sides of the center electrode 3d are bent inward closer to the RF interconnection 5 at the edge 22a of the overlay 22. These bent end portions, 3j and 3k, may compensate for the impedance mismatching caused in the portion corresponding to the gap 2f between the ground pattern 7 and the center electrode 3d. Moreover, the bent end portions, 3j and 3k, intersect just at the edge 22a of the overlay 22, namely, the edge 22a of the overlay crosses the bent end portions, 3j and 3k, in a right angle, which may securely enhance the function to prevent the FPC board 41 from being bent at the edge 22a of the overlay 22.

(Seventh Embodiment)

FIG. 6A is a plan view of another FPC board 51 according to the seventh embodiment of the present application. A feature of the present embodiment is that the FPC board 51 provides two RF interconnections 65 and the arrangement of the electrodes, 3a to 3g, in particular, the electrodes for the ground pattern.

The RF interconnections 65 extend straight from the edge 2a and in parallel to the center axis AX. The outermost electrodes, 3a and 3g, are for DC signals and/or signals with low frequency components, which is same with those of the aforementioned embodiment, and connected to the interconnection 4. The electrodes, 3b and 3f, provided inside of the outermost ones, 3a and 3g, provide the extended portions, 63q and 63r, extending straight from the edge 2a and bent inward to form the bent end portions, 63h and 63m. That is the ends P of the end portions, 63h and 63m, come closer to respective RF interconnection 65 in the joining portion 2e and covered with the overlay 22. Similar to the former embodiments, the bent end portions, 63h and 63m, may compensate for the impedance mismatching of the RF interconnections 65 closer to the electrodes, 3c and 3e, where the ground pattern 7 in the back surface 2d forms the gap against the electrodes, 3c and 3e. Because of the existence of the extended portions, 63q and 63r, in the extended region $A_1$, where the extended portions, 63q and 63r, are exposed from the overlay 22, may effectively protect the RF interconnections 65 from breakages due to the bending of the FPC board 51 along the boundary line L and/or the edge 22a of the overlay 22.

The other FPC board 61 whose plan view is shown in FIG. 6B is a modification of the FPC board 51 shown in FIG. 6A. In the FPC board 61, the center electrode 3d, which is connected to the ground pattern 7 in the back surface 2d through the via hole 3v, provides the extended portion 63t in the extended region $A_1$. Moreover, the extended portion 63t has two end portions 63s in the joining portion 2e. One of the end portions 63s is bent toward the RF interconnection 65 connected to the electrode 3c, and the other end portion 63s is bent toward the other RF interconnection 65. Thus, these bend end portions 63s and the other bent portions, 63h and 63m, shown in FIG. 6A may effectively adjust the characteristic impedance of the RF interconnection 65, in particular, the impedance mismatching in the portion corresponding to the root thereof closer to respective electrodes, 3c and 3e.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A flexible printed circuit (FPC) board connected with a rigid circuit board, comprising:

a top RF electrode provided in one end of a top surface of the FPC board and a back RF electrode provided in the one end of a back surface of the FPC board, the top RF electrode extending an RF interconnection and being electrically connected with the back RF electrode through a via hole, the back RF electrode being soldered with the rigid circuit board; and a top ground electrode provided in the one end of the top surface of the FPC board and a back ground electrode provided in the one end of the back surface of the FPC board, the back ground electrode being electrically connected with the top ground electrode through a via hole, the top ground electrode being next to the top RF electrode, the back ground electrode being next to the back RF electrode and soldered with the rigid circuit board, wherein the back ground electrode extends a ground pattern as forming a gap against the back RF electrode, and the top ground electrode extends an extended portion terminated in the one end of the FPC board, and wherein the top ground electrode further includes an end portion extending from the extended portion and terminated in the one end of the FPC board, the end portion being bent toward the RF interconnection in a portion corresponding to the gap in the back surface.

2. The FPC board of claim 1, wherein the end portion of the top ground electrode has a width substantially equal to a width of the extended portion of the top ground electrode.

3. The FPC board of claim 1, wherein the one end of the FPC board includes an electrode region and an extended region that is next to the electrode region, the electrode region including the top RF electrode, the back RF electrode, the top ground electrode, and the back ground electrode, and wherein the extended portion of the top ground electrode is terminated in the extended region of the FPC board.

4. The FPC board of claim 1, further comprising another top ground electrode, a ground pattern in the back surface of the FPC board, and another back ground electrode that is electrically connected with the another top ground electrode through a via hole, the top ground electrode and the another top ground electrode sandwiching the top RF electrode, the ground pattern connecting the back ground electrode with the another back ground electrode sandwiching the back RF electrode, wherein the back ground electrode, the ground pattern, and the another back ground electrode surround the back RF electrode with the gap.

5. The FPC board of claim 1, wherein the another top ground electrode provides an extended portion terminated in the one end of the FPC board.

6. The FPC board of claim 5, wherein the another top ground electrode further provides an end portion extending from the extended portion of the another top ground electrode, and wherein the end portion of the another top ground electrode is bent toward the RF interconnection in a portion corresponding to the gap in the back surface.

* * * * *